(12) United States Patent
Ganesan

(10) Patent No.: US 6,433,601 B1
(45) Date of Patent: Aug. 13, 2002

(54) PULSED D-FLIP-FLOP USING DIFFERENTIAL CASCODE SWITCH

(75) Inventor: Anand Ganesan, Santa Clara, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/738,781

(22) Filed: Dec. 15, 2000

(51) Int. Cl.[7] .......................... H03K 3/289; H03K 3/356
(52) U.S. Cl. ........................ 327/202; 327/203; 327/208
(58) Field of Search ............................... 327/199, 201, 327/203, 208

(56) References Cited

U.S. PATENT DOCUMENTS

| | | | |
|---|---|---|---|
| 4,686,392 A | 8/1987 | Lo | 326/115 |
| 5,023,480 A | 6/1991 | Gieseke | 326/119 |
| 5,075,574 A | 12/1991 | Boudon | 326/127 |
| 5,192,878 A | 3/1993 | Miyamoto et al. | 327/77 |
| 5,272,397 A | 12/1993 | Chen et al. | 326/97 |
| 5,508,648 A * | 4/1996 | Banik | 327/203 |
| 5,548,231 A | 8/1996 | Tran | 327/52 |
| 5,764,089 A * | 6/1998 | Partovi et al. | 327/208 |
| 5,777,491 A | 7/1998 | Hwang et al. | 326/113 |
| 5,789,956 A * | 8/1998 | Mahant-Shetti et al. | 327/202 |
| 6,090,153 A | 7/2000 | Hwang et al. | 326/93 |

OTHER PUBLICATIONS

Vladimir Stojanovic and Vojin G. Oklobdzija, "Comparative Analysis of Master–Slave Latches and Flip–Flops for High–Performance and Low–Power Systems", IEEE Journal of Solid–State Circuits, vol. 34, No. 4, Apr. 1999, pp 536–548.
Draper et al., "Circuit Techniques in a 266–MHz MMX–enabled processor", IEEE Journal of Solid–State Circuits, vol. 32, Nov. 1997, pp 1650–1664.

* cited by examiner

Primary Examiner—Dinh T. Le
(74) Attorney, Agent, or Firm—Harold Tsiang

(57) ABSTRACT

A differential cascode structure is configured to propagate a data state to a static latch at each active edge of a clock. A clock generator enables the communication of the data state and its inverse to the latch for a predetermined time interval. In a first embodiment, each cascode structure includes three gates in series, the gates being controlled by the clock signal, a delayed inversion of the clock signal, and the data state or its inverse. In an alternative embodiment, each cascode structure includes two gates in series, the gates being controlled by the clock signal and the delayed inversion of the clock signal. In this alternative embodiment, each of these cascode structures is driven directly by the data signal or its inverse. The static latch obviates the need to precharge nodes within the device, thereby minimizing the power consumed by the device. The latch preferably comprises cross-coupled inverters, which, being driven by the differential cascode structure, enhance the switching speed.

9 Claims, 4 Drawing Sheets

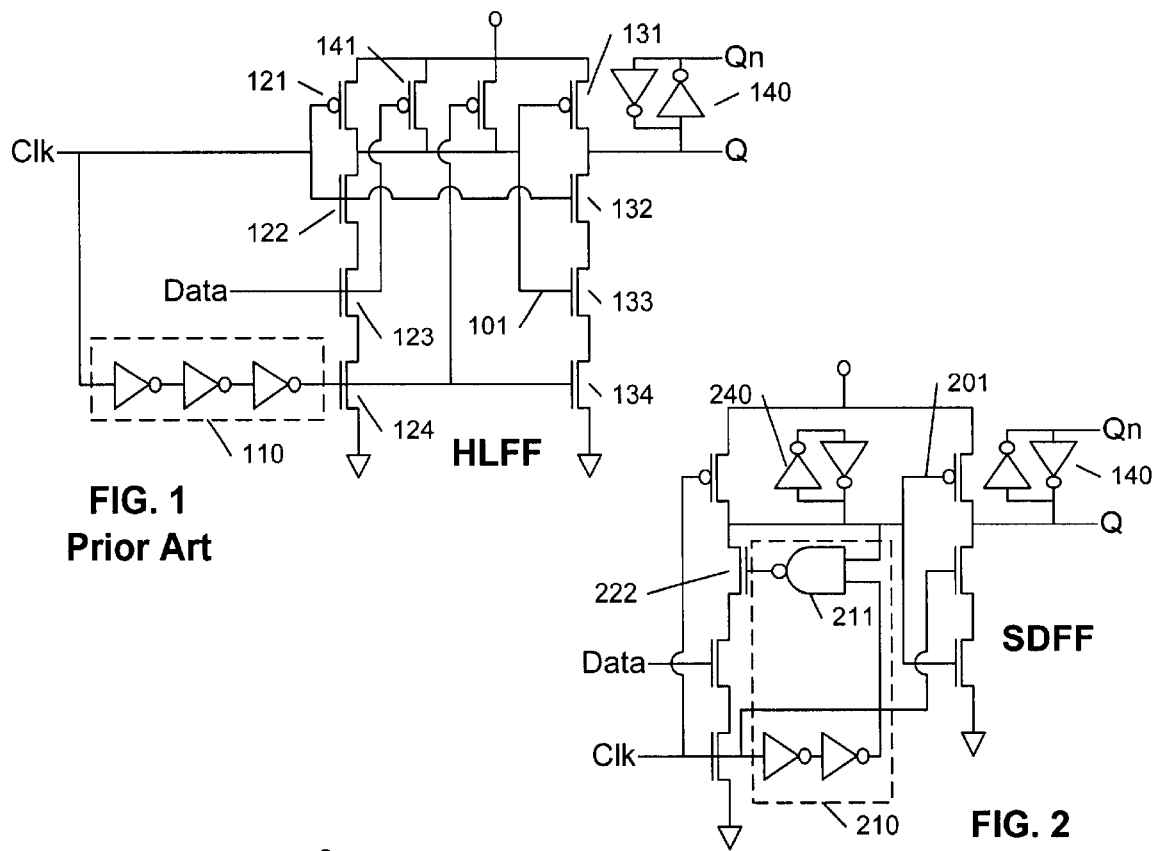
FIG. 1 Prior Art
FIG. 2 Prior Art
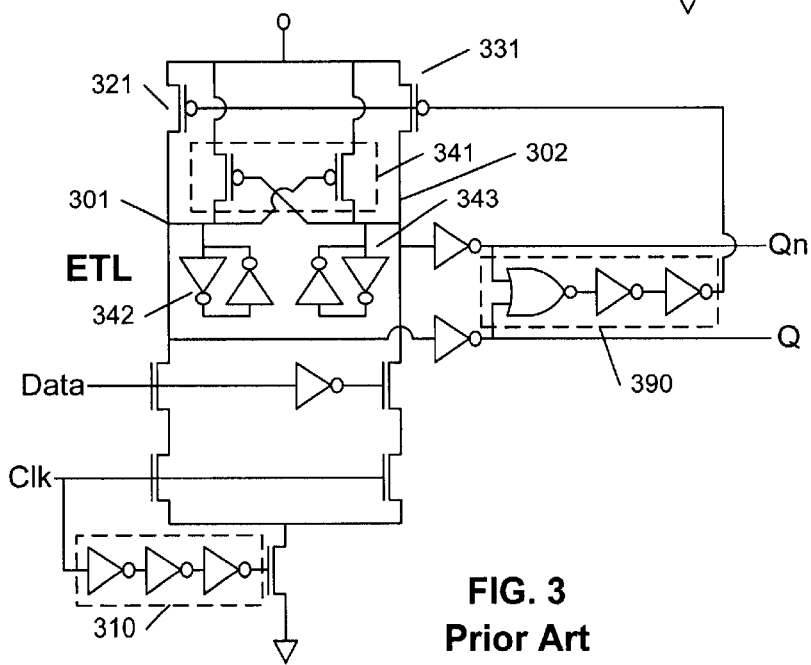
FIG. 3 Prior Art

PULSED D-FLIP-FLOP USING DIFFERENTIAL CASCODE SWITCH

BACKGROUND OF THE INVENTION

1. Field of the Invention

This invention relates to the field of electronic circuit design, and in particular to a pulse-triggered D-Flip-Flop (P-DFF) that utilizes a cascode voltage switch to achieve minimal set-up time and propagation delay, while also consuming minimal power.

2. Description of Related Art

A Data-Flip-Flop (DFF) is configured to "read" a data input at a particular point in each clock cycle. The output of the DFF provides the value that was read, independent of subsequent changes, or noise, on the data input, until the next data value is read. The data input must be stable while it is being read into the DFF, else the read value may be indeterminable. Ideally, the reading of the data input occurs instantaneously, so that the sensitivity of the DFF to changes on the data input is minimized. Also ideally, the instantaneous read occurs at exactly the same point within each clock cycle.

Pulse-triggered latches and flip-flops are commonly used in the art to approximate the ideal performance of a DFF as closely as possible [1]. In a pulse-triggered latch, a pulse generator provides a narrow pulse at each rising or falling (active) edge of a clock. While the pulse is asserted, the signal on a data input line is communicated to the output of the latch. While the pulse is not asserted, the output of the latch remains unchanged. In order to maximize the stability of the output, and to reduce the stability requirements on the data input, the width of the asserted pulse is kept as narrow as possible.

[1]. Vladimir Stojanovic and Vojin G. Oklobdzija, "Comparative Analysis of Master-Slave Latches and Flip-Flops for High-Performance and Low-Power Systems", IEEE Journal of Solid-State Circuits, Vol 34, No. 4, April 1999, pp 536–548, and incorporated by reference herein.

The performance of a DFF is assessed in terms of its cycle delay, or "sequencing overhead", and its power consumption. The sequencing overhead is defined herein as the minimum time required to read the data into the device and to produce a stable output corresponding to this data input. This includes any set-up requirements imposed on the data input to assure a reliable read of the data value, plus the time required to propagate the data input to the output of the device. This sequencing overhead corresponds, inversely, to the maximum speed that a serial string of DFFs can be reliably operated. If the DFF includes additional internal logic, such as scan logic that is used for testing the device, the sequencing overhead includes the impact, if any, that the additional internal logic imposes on the propagation of the data input to the output of the DFF during normal (i.e. performance) operation. The power consumption of a DFF typically depends upon the energy required to change the state of the elements within the DFF, and hence, is typically dependent upon pattern of data values read by the DFF. Generally, the power consumption of a DFF is estimated based upon an assumed random data input pattern to the DFF.

FIGS. 1–3 illustrate example prior art pulsed-D-Flip-Flops. In FIG. 1, an example "hybrid-latch" flip-flop (HLFF) is illustrated [2, 3] that achieves a high speed performance via a pre-charging of the internal nodes 101 of the flip-flop to avoid the delay associated with changing the value of the internal nodes to the pre-charged value when the device is clocked to read in the data. When the clock (CLK) signal is low, the p-channel device 121 conducts, thereby precharging the internal node 101 to a high state. This internal high state has no effect on the output Q, because the low clock signal also places the n-channel device 132 into a non-conducting state, thereby precluding a discharge of the voltage at Q. Also, while the clock signal is low, the inverting delay logic 110 places the n-channel devices 124 and 134 into a conducting state.

[2]. ibid, FIG. 17.
[3]. Draper et al., "Circuit Techniques in a 266-MHz MMX-enabled processor", IEEE Journal of Solid-State Circuits, Vol 32, November 1997, pp 1650–1664, and incorporated by reference herein. See FIG. 10.

When the clock signal goes high, the p-channel device 121 is placed in a non-conducting state, and device 122 in a conducting state. Because, initially, devices 122 and 124 are in a conducting state, the value of the data signal at the gate of n-channel device 123 determines the state of the internal node 101. If the data signal is low, the internal node 101 remains at a high state; if the data signal is high, the internal node 101 is discharged through the serial path of devices 122, 123, and 124 to a low state. Also when the clock signal initially goes high, devices 132 and 134 are in a conducting state, and the inversion of the state of the internal node 101 is communicated to the output Q.

The asserted clock signal propagates through the inverted delay logic 110, and after approximately three gate-time delays, the high value at the clock produces a low value at the gates of devices 124 and 134, placing each of them in a non-conducting state. In this non-conducting state, neither the internal state 101 nor the output Q can be discharged to a low state. Because the internal state 101 cannot be discharged to a low state, the state of the p-channel device 131 cannot change. If the internal state 101 had been low, device 131 would have been conducting, and the output Q would be in a high state, and will remain in this high state because the device 134 is in a non-conducting state. If the internal state 101 had been high, device 131 would have been non-conducting, and the output Q would have been in a low state (via 132, 133, 134 when the clock initially goes high). The internal state 101 will remain in this high state because device 124 is non-conducting.

When the clock again goes low, the internal state 101 is again precharged to a high state. This precharging has no effect on the output Q, because the device 132 is non-conducting when the clock signal is low and cannot discharge the output Q if it is currently in the high state. The precharging of the internal node 101 places device 131 into a non-conducting state, and thus cannot charge the output Q if it is currently in the low state.

The internal state 101 is also precharged if the data input value is in a low state, via the p-channel device 141, regardless of the state of the clock. This precharging cannot affect the output Q unless both devices 132 and 134 are conducting, which occurs only during the intended time for the data input to be propagated to the output Q.

The cross-coupled inverters 140 provide a complementary output Qn, and provide an additional margin of stability to the output Q during transitions in the above described process, or during long periods of clock inactivity.

As described above, the state of the internal node is dependent upon the data signal only during the period that both n-channel devices 122 and 124 are conducting. This time of mutual conduction is determined by the delay block 110. The delay time of the delay block 110 is set to be as short as possible, while still assuring that the value on the data line will be propagated to the output Q. Because the internal node 101 is precharge to a high state, the delay for propagating a data low state is merely the delay of the n-channel device 132 for discharging the output Q to a low state, if it is not already in the low state. The delay for propagating a data high state is the delay of the n-channel device 122 for discharging the internal node 101, plus the delay of the p-channel device 131 for charging the output node Q to a high state, if it is not already in the high state. Note, however, that the delay of the device 110 need only be long enough for the n-channel device 122 to discharge the internal node 101 via the data-controlled device 123, or for the n-channel device 132 to discharge the output Q via the internal-node-controlled device 133. The hold time of a data high input, the time for which the data must remain high, will be slightly greater than the delay time of the device 110, so as not place the p-channel device 141 into a conductive state until the output Q is brought to a logic high state.

The amount of energy consumed by the HDFF of FIG. 1 is dependent upon the number of times each node is charged or discharged. If the data input is a constant low state, very little energy is consumed, because the internal node 101 remains at a high state, and the output Q remains at a low state. If, on the other hand, the data input is a constant high state, the internal node will be continually pre-charged and discharged. Thus, even during periods of inactivity, energy will be consumed, if the inactive period corresponds to the data input being high. During normally active periods, the average energy consumption is comparable to conventional static (i.e. non-precharged) flip-flop structures.

FIG. 2 illustrates an example semidynamic flip-flop SDFF [4], which also uses a pre-charging technique to achieve high speeds. The delay block 210 serves a similar function to the delay block 110 of FIG. 1 of enabling a propagation of the data input signal to the internal node 201 only during a short time period after the clock transitions from a low to high state. The NAND gate 211 is configured to place the n-channel device 222 into a non-conducting state as soon as the internal node 201 is pulled low (via a high data input), thereby eliminating the aforementioned requirement of holding the data input at a high state for a duration longer than the delay of the device 210. In effect, the device 210 is a self-regulating device that automatically limits the sensitivity of the SDFF to the pre-set delay associated with the device 210, or to the actual time required to propagate the data input to the internal node, whichever is less. The cross-coupled inverters 140, 240 serve to stabilize the output Q and the internal node 201 during transitions, or during long periods of clock-inactivity.

[4]. Stojanovic, op cit, FIG. 18.

Because of the pre-charging process, the SDFF of FIG. 2 exhibits similar energy-consuming characteristics to the HDFF of FIG. 1, particularly with regard to a continuous high data input. The SDFF structure, on the other hand, is better suited for embedded logic functions than the HDFF structure. The embedded logic allows the flip-flop to effect other functions, in addition to the clocked-D-to-Q function of a flip-flop, including asynchronous or synchronous sets and resets, the inclusion of scan-test logic, and so on.

FIG. 3 illustrates an example edge-triggered latch (ETL) that includes self-resetting logic [5, 6]. In operation, the internal nodes are precharged to a logic high state, via the resetting logic 390. The resetting logic 390 has a specified delay. Whenever the Q and Qn signals differ, and after the specified delay, the resetting logic 390 places the p-channel devices 321, 331 into a conductive state, which automatically resets the internal nodes 301, 302 to a logic high state. Note that, because the Q and Qn signals are directly coupled to the internal nodes 301, 302, these nodes will both be reset to a logic low state, and thus devices that are configured to read the Q or Qn values associated with the information-state of the ETL must be configured to read the Q or Qn values before these nodes are automatically reset.

[5]. Draper, op cit, FIG. 12.
[6]. Stojanovic, op cit, FIG. 19.

The delay logic 310 operates similar to the delay logic 110 of FIG. 1, and sensitizes the ETL to the data input only during the delay time of the device 310 after the rising edge of the clock (Clk). If the data input is high, the internal node 301 is brought low at the rising edge of the clock, and the output Q is brought high. If the data input is low, the internal node 302 is brought low at the rising edge of the clock, and the output Qn is brought high. The change of state of either of the outputs Q, Qn to a high state initiates the aforementioned automatic reset process, which resets the outputs Q and Qn to a low state, after the reset delay period.

When the outputs Q and Qn are both brought to the low state, and after another reset delay period, the devices 321 and 331 are brought to a non-conducting state. The cross-coupled p-channel devices 341 assure that the 'inactive' node is maintained at the high state when the opposite node is pulled low when the data input is read. The cross-coupled inverters 342, 343 stabilize the outputs Q and Qn between the rising edge of the clock and the time of reset.

Note that, because both internal nodes 301, 302 are pre-charged to a high state at every clock cycle, and one of them is discharged at every clock cycle, the ETL consumes a substantial amount of energy, independent of the pattern of values at the data input. Additionally, the dynamic operation of the ETL is incompatible with non-dynamic/static circuits that assume a stable output after the output is set to its intended state.

BRIEF SUMMARY OF THE INVENTION

It is an object of this invention to provide a high-speed flip-flop that consumes minimal power. It is a further object of this invention to provide a high-speed flip-flop that is static. It is a further object of this invention to provide a flip-flop structure that facilitates additional logic functions within the flip-flop.

These objects and others are achieved by providing a differential cascode structure that is configured to propagate a data state to a static latch at each active edge of a clock. A clock generator enables the communication of the data state and its inverse to the latch for a predetermined time interval. In a first embodiment, each cascode structure includes three gates in series, the gates being controlled by the clock signal, a delayed inversion of the clock signal, and the data state or its inverse. In an alternative embodiment, each cascode structure includes two gates in series, the gates being controlled by the clock signal and the delayed inversion of the clock signal. In this alternative embodiment, each of these cascode structures is driven directly by the data signal or its inverse. The static latch obviates the need to precharge nodes within the device, thereby minimizing the power consumed by the device. The latch preferably comprises cross-coupled inverters, which, being driven by the differential cascode structure, enhance the switching speed.

BRIEF DESCRIPTION OF THE DRAWINGS

The invention is explained in further detail, and by way of example, with reference to the accompanying drawings wherein:

FIG. 1 illustrates an example prior art hybrid latch flip-flop (HLFF).

FIG. 2 illustrates an example prior art semidynamic flip-flop (SDFF).

FIG. 3 illustrates an example prior art edge triggered latch (ETF).

Throughout the drawings, the same reference numerals indicate similar or corresponding features or functions.

DETAILED DESCRIPTION OF THE INVENTION

Figure 4:
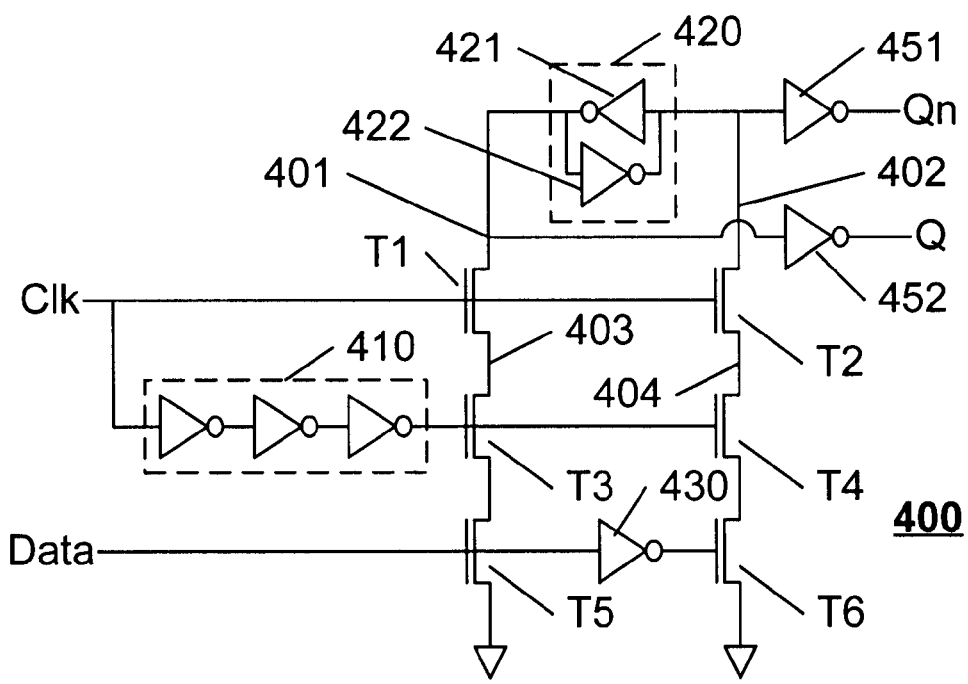
FIG. 4 illustrates an example pulsed flip-flop in accordance with this invention.

FIG. 4 illustrates an example pulsed flip-flop 400 in accordance with this invention. The flip-flop 400 includes a delay block 410, which, in conjunction with the gates T1 through T4, forms a clock generator that enables a propagation of the data input state and its inverse to differential nodes 401, 402 for a predefined duration after a rising edge of a clock signal, similar to the operation of the delay blocks 110, 210, and 310 in FIGS. 1–3.

In accordance with this invention, the flip-flop 400 includes a static latch 420 that is configured between the differential nodes 401 and 402. As illustrated, the static latch 420 preferably comprises cross-coupled inverters. The latch 420 is configured to maintain the values at the differential nodes 401, 402 indefinitely, until a new value is propagated from the data input. In the example circuit of FIG. 4, inverters 451 and 452 are illustrated as providing the output signal Q and its inverse Qn, although these devices merely provide a buffering function to subsequent stages. For ease of reference and comparison, the propagation delay of the flip-flop 400 is defined herein without regard to such buffering devices. In like manner, inverter 430 is illustrated in FIG. 4 as providing an inversion of the data input state. In a dual-rail system, wherein, for example, the data input and its complement are provided from complementary outputs of a prior stage, the inverter 430 would not be needed.

Each of the series, or cascode, structures T1-T3-T5 and T2-T4-T6 is configured to propagate the state of the data input and its inverse to the internal nodes 402, 401, respectively. When the clock signal (Clk) is in a low state, transistor switches T1 and T2 are in a non-conducting state, and transistor switches T3 and T4 are in a conducting state. For ease of reference, the components T1–T6 are referred to hereinafter as switches, which may be embodied as transistors or other controllable switching devices. In like manner, the switches T1–T6 are illustrated as n-channel transistors that provide a conductive path to a ground reference voltage, although a corresponding p-channel structure, using a positive reference voltage, or other arrangement, will also be evident to one of ordinary skill in the art.

If the data input is at a high state, the node 403 between switches T1 and T3 will be at the reference ground potential, via the conductive state of switches T3 and T5. At the same time, the node 404 between switches T2 and T4 will be at in a 'floating' state, due to the non-conductive state of switches T2 and T6. Conversely, if the data input is at a low state, the node 404 between switches T2 and T4 will be at the reference ground potential, via the conductive state of switches T4 and T6, and the node 403 between switches T1 and T3 will be at in a 'floating' state, due to the non-conductive state of switches T1 and T5.

When the clock signal goes high, switches T1 and T2 are placed in a conductive state, and the asserted low state, at either node 403 or node 404, depending upon the state of the data input, is propagated to the corresponding node 401 or node 402, respectively. Assuming that the sizes of the switches in the series arrangements are appropriately dimensioned relative to the sizes of the devices forming the latch 420, the propagated low state will cause the latch 420 to assume the asserted state. That is, assume that before the clock signal is asserted, the latch 420 is at a state wherein the voltage at node 401 is high. If the data input state is high when the clock signal goes high, the cascode arrangement T1-T3-T5 will be in a conductive state, and the voltage potential at node 401 will be discharged to the reference ground potential. Note, however, that, as compared to the aforementioned pre-charge arrangements of FIGS. 1–3, the arrangement T1-T3-T5 must have sufficient conductivity to effect a discharge of the voltage at the node 401 and also to effect a change of state of the latch 420, so that the voltage at node 401 remains at the discharged state. This sufficient conductivity is provided by sizing the transistors T1-T3-T5 relative to the size of the device in the latch 420 that pulls the node 401 high, so that the ratio of the conductivity provided by this sizing strongly favors the discharge of the node 401 (commonly termed "ratio logic").

In a preferred embodiment, the switches T3–T5 and T4–T6 are embodied as transistors that are sufficiently sized to provide a relatively high capacitance, compared to the capacitance of the output of the latch 420, and thereby effect a rapid discharge of the voltage at the appropriate node 401, 402 when the switches T1, T2 are placed in a conductive state. Continuing with the example of a high state at 401 and a high data input state, as the node 401 is being discharged, the corresponding input to the cross-coupled inverter 422 in the latch 420 causes the inverter 422 to start to transition to a high output state, which corresponding causes the inverter 421 that had been providing the high state at the node 401 to transition to a low output state. Note that in this embodiment, the opposite node, 402 in this example, is driven to the logic high state via the inverter 422 of the latch 420, because the voltage at the node 404 is 'floating' when the data input is high. Thus, the total propagation delay is the time required to propagate the low state through the switch T1 to the node 401, plus the time required to propagate the opposing state to the node 402 through the inverter 422. Note that, in a preferred embodiment, the data-controlled switches (hereinafter data-switches) T5 and T6 are placed at the 'bottom' of the stack of clock-controlled switches T1–T3 and T2–T4, closest to the reference voltage, and the clock-not switch T3, T4 is placed in the center of the stack, so that the appropriate node 402, 404 is discharged at the time of the next rising edge of the clock.

After the delay associated with the propagation of the rising clock signal through the inverting delay block 410, the switches T3 and T4 are placed in a non-conducting state, thereby isolating subsequent changes on the data input from the internal nodes 401, 402 until the next active edge of the clock. While either of the switches in the paths T1–T3 and T2-T4 are in a non-conductive state, the latch 420 is unaffected by any changes at the data input, and thus retains the last data state that was read when both switches in each path T1–T3 and T2–T4 are in a conductive state.

Figure 5:
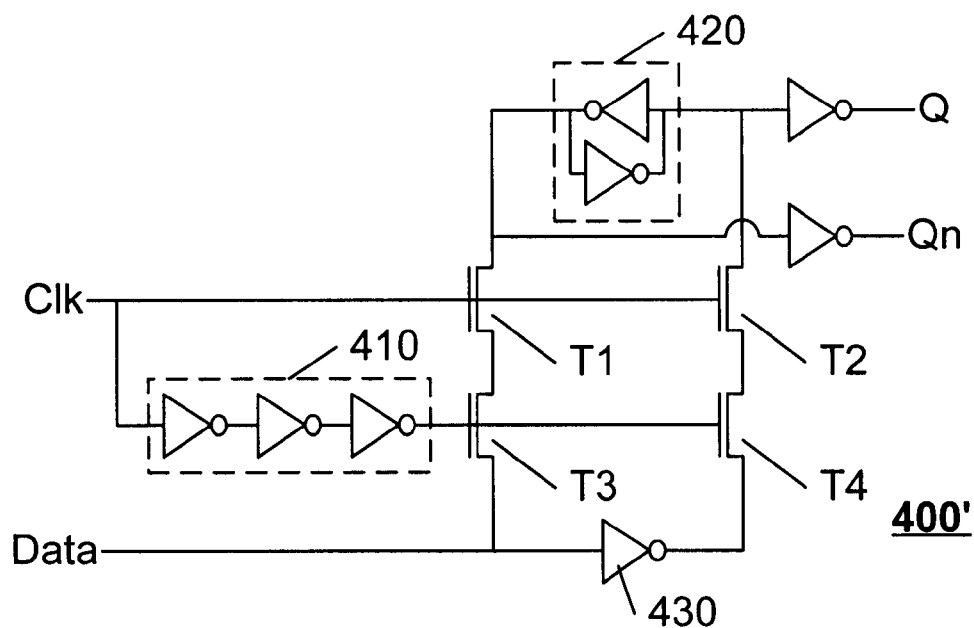
FIG. 5 illustrates an example alternative pulsed flip-flop in accordance with this invention.

FIG. 5 illustrates an example alternative pulsed flip-flop 400' in accordance with this invention. In this embodiment, the cascode structures T1–T3 and T2–T4 are driven directly by the input data signal and its inverse. Assuming that the input data signal is provided by a conventional logic device that provides a 'hard' high and low state (i.e. not a 'floating' high or low state), similar to the 'hard' logic output of the conventional inverter 430, each cascode structure T1–T3 and T2–T4 will communicate the hard logic state to the nodes 401, 402. Note that both the hard logic high and hard logic low states will be propagated to the nodes 401, 402, thereby allowing the nodes 401, 402 to assume the proper state, without reliance on the latch 420 to provide the logic high state when the opposing node is discharged, as discussed above with regard to FIG. 4. In this manner, the propagation delay is merely the delay through the switches T1, T2, assuming that the data state is provided before the active edge of the clock, nominally, at one 'gate time' before the active edge, to allow the data state to be propagated through the switches T3, T4. Note that the structure of FIG. 5 does not require the use of ratio logic, as used in the structure of FIG. 4, thereby potentially increasing the reliability of the design, particularly in systems having noisy or varying power sources.

As would be evident to one of ordinary skill in the art, alternative structures to provide the same function as the examples circuits in FIGS. 4 and 5 may be used as well. For example, to enhance the propagation of a high state, as well as a low state, through the switches T1–T3 and T2–T4 of FIG. 5, each of the switches T1–T4 may be configured as complementary pass-gates, comprising both p-channel and n-channel devices in parallel. In like manner, a complementary p-channel embodiment to the illustrated n-channel embodiments (T1–T6) of FIG. 4 can be provided in lieu of, or in addition to, the illustrated n-channel embodiment. As is known in the art, a p-channel embodiment optimizes the speed of bringing devices to a high voltage state, and an n-channel embodiment optimizes the speed of bringing devices to a low voltage state. If both structures are used, optimal speed for both directions of transition can be achieved. These and other alternative embodiments will be evident to one of ordinary skill in the art in view of this disclosure.

The use of a static latch 420 also facilitates the inclusion of embedded logic with the structure of the flip-flops 400, 400'. An asynchronous reset, for example, can be implemented by merely replacing one of the cross coupled inverters of the latch 420 with a two-input NAND or NOR gate whose second input is the reset control signal. In like manner, alternative embedded structures can be placed in series with, or parallel to, the cascode structures to provide synchronous or asynchronous functions, as well as functions that are dependent upon other clocking signals.

Figure 6:
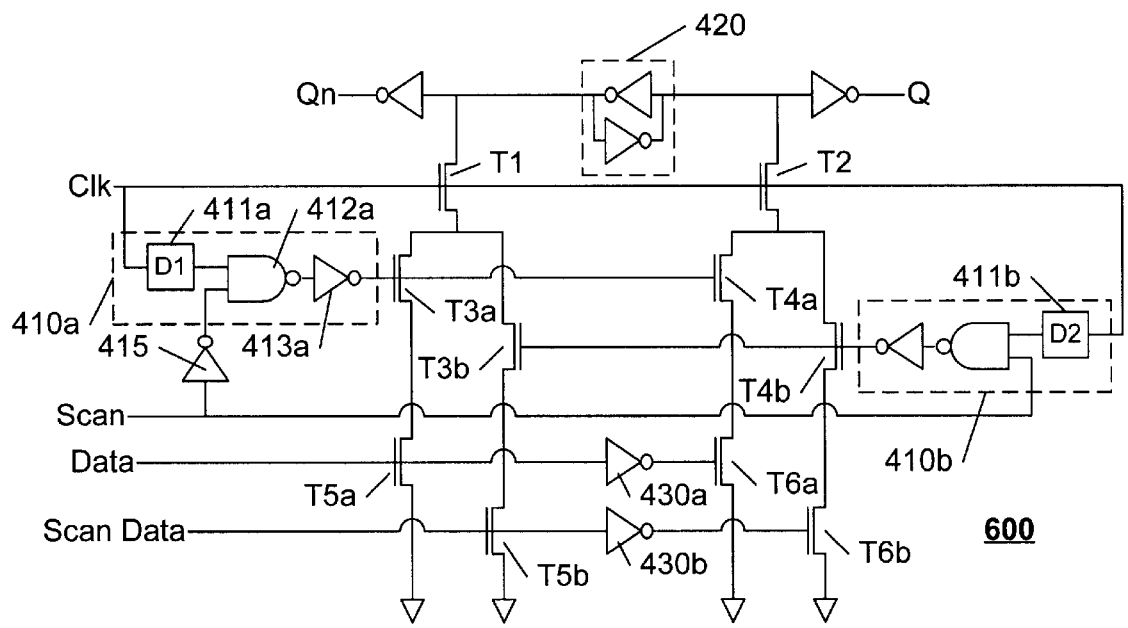
FIG. 6 illustrates an example pulsed flip-flop with embedded logic for scan-test in accordance with this invention.

FIG. 6 illustrates, for example, a pulsed flip-flop 600 with embedded logic for scan-test, wherein an alternative data path is used to propagate data through a system during a test procedure. As illustrated in FIG. 6, the normal, or operational, data is read into the static latch 420 via the cascode structures T1–T3a-T5a and T2-T4a-T6a, as discussed above with regard to FIG. 4. The alternative, or scan, data is read into the static latch 420 via the cascode structures T1-T3b-T5b and T2-T4b-T6b. A control signal, Scan, determines whether the operational data or the scan data will be read into the latch 420, by controlling which devices T3a, T4a or T3b, T4b are forced into a non-conducting state. A high Scan state, via the inverter 415, forces the NAND gate 412a to a high state, and the inverter 413a to a low state, thereby forcing the switches T3a and T4a into a non-conductive state, independent of the clock signal. Correspondingly, the high Scan state enables the NAND gate 412b to propagate the delayed clock signal to place the switches T3b and T4b into a conductive and non-conductive state in dependence upon the clock signal, as discussed above with regard to the delay block 410 in FIG. 4. Similarly, a low Scan state forces the switches T3b and T4b into a non-conductive state, and sensitizes the switches T3a and T4a to the state of the clock signal.

As illustrated in FIG. 6, the delay block 410a can be configured to have different delay characteristics than the delay block 410b, as illustrated by delays of D1 and D2 being associated with elements 411a and 411b, respectively. In this manner, different clock speeds can be used for normal operation, wherein the data input is read, and for test operation, wherein the scan data is read.

Figure 7:
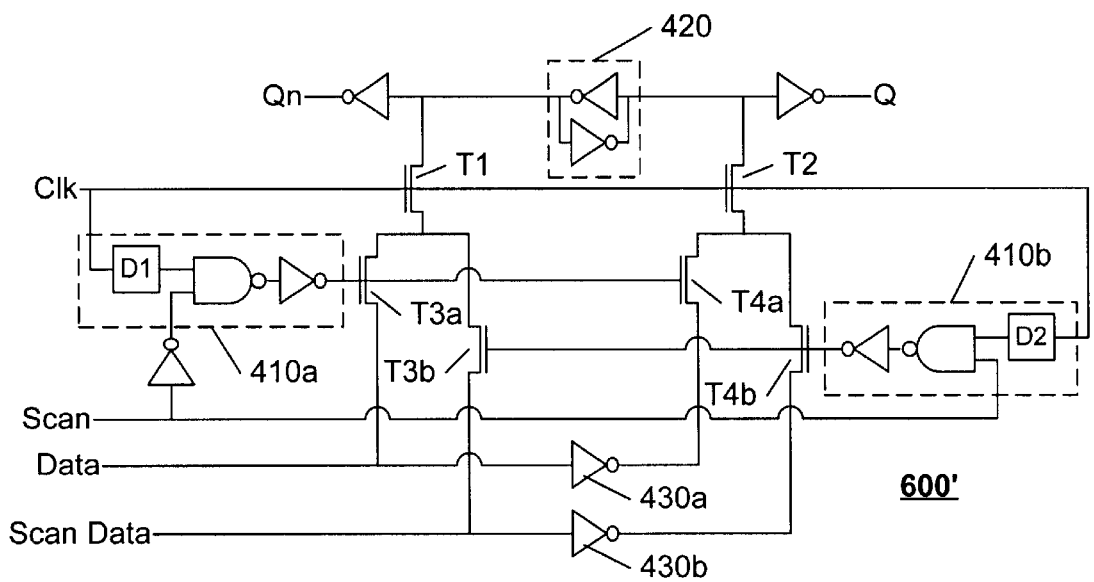
FIG. 7 illustrates an example alternative pulsed flip-flop with embedded logic for scan-test in accordance with this invention.

FIG. 7 illustrates an example alternative pulsed flip-flop 600' with embedded logic for scan-test in accordance with this invention. The cascode structures T1–T3a and T2–T4a propagate the 'hard' data state and its inverse to the latch 420, as discussed above with regard to the cascode structures of FIG. 5. Similarly, the cascode structures T1–T3b and T2–T4b propagate the 'hard' scan data and its inverse to the latch 420. The choice of whether the operational data or the scan data is read into the latch at the rising edge of the clock is determined by the state of the Scan input, as discussed above with regard to FIG. 6.

Note that, in FIGS. 6 and 7, by placing the additional embedded logic (the "b" paths of FIGS. 6 and 7) in parallel with the operational cascode structures (the "a" paths), the operational performance of the flip-flip 600, 600' is not degraded by the presence of the additional embedded logic, except for an additional capacitive load on some nodes.

Figure 8:
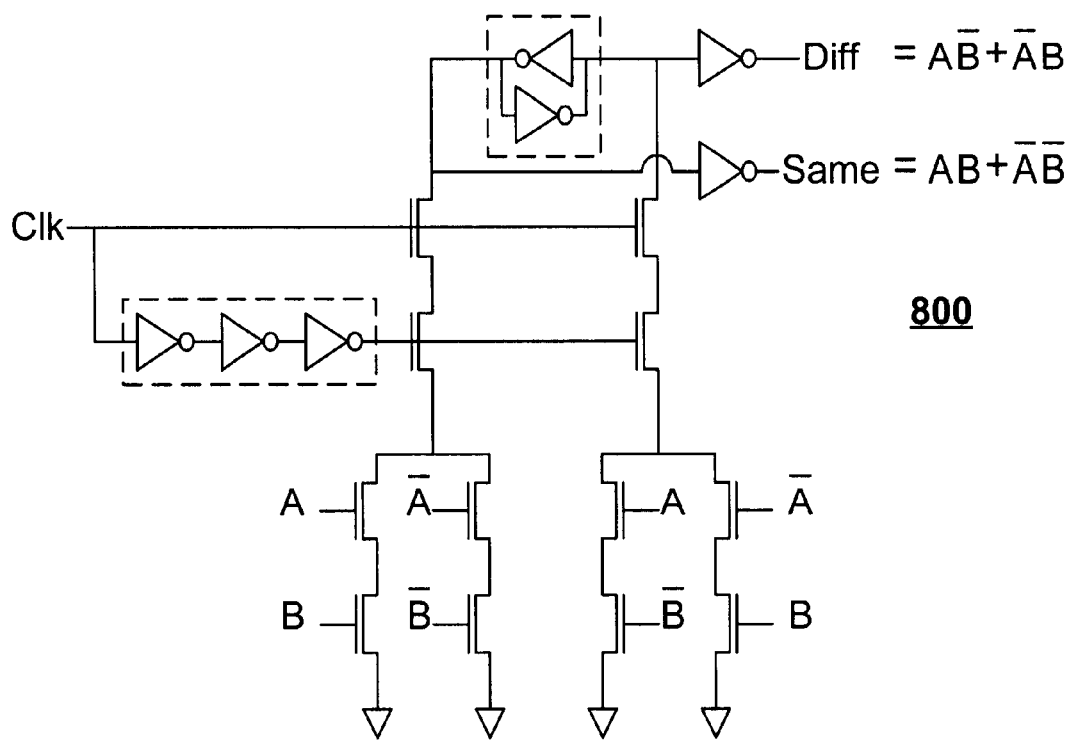
FIGS. 8 and 9 illustrate other example embodiments of embedded logic in a pulsed flip-flop in accordance with this invention.
Figure 9:
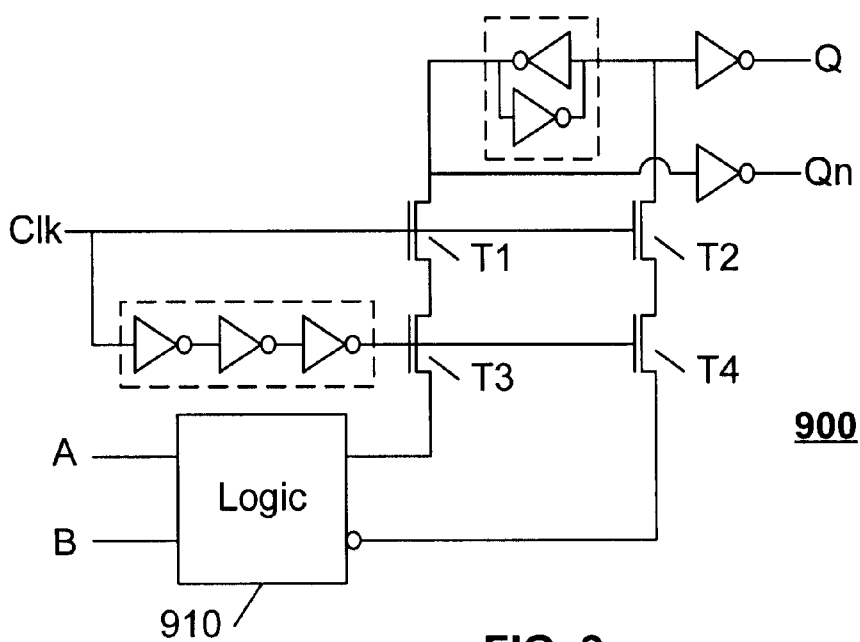

FIGS. 8 and 9 illustrate other example embodiments of embedded logic with a flip-flop in accordance with this invention. FIG. 8 illustrates an arrangement of gates 800 that effect a comparator function, such that the "same" output is high if the inputs A and B are equal, and the "diff" output is high if the inputs A and B are not equal.

FIG. 9 illustrates the versatility of the flip-flop in accordance with this invention. The example circuit 900 includes a logic block 910, with complementary outputs that are connected to each cascode structure T1–T3 and T2–T4, respectively. As would be evident to one of ordinary skill in the art, although two inputs, A and B, are illustrated, the logic block 910 may be any combination of an arbitrary number of input signals. Note also that the sequencing overhead of the circuit 900 is merely the delay through the logic block 910 plus the single gate delay through the transistors T1, T2, as discussed above with respect to FIG. 5. That is, the effect of embedded logic 910 on the performance of the pulsed flip-flop of this invention is merely the addition of any delay associated with the embedded logic 910.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

I claim:
1. A circuit comprising:
  a first network configuration that is configured to provide a first node state corresponding to a data input state,
  second network configuration that is configured to provide a second node state corresponding to an inversion of the data input state, a pulse generator that is responsive to an external clock signal and is configured to enable a propagation of the data input state and the inversion of the data input state to the first node state and to the second node state, for a predefined duration after an active edge of the clock signal, and a latch that is operably coupled between the first network configuration and the second network configuration, and is configured to store an internal state corresponding to the data input state, for producing an output state for a continuous duration, until a subsequent rising edge of the clock signal;

wherein:

the first network configuration comprises a first series arrangement of switches, responsive to the clock signal, that includes an input and an output, and the input of the first series arrangement corresponds to the data input state, and the output of the first series arrangement provides the first node state, and the second network configuration comprises a second series arrangement of switches, responsive to the clock signal, that includes an input and an output, and the input of the second series arrangement corresponds to an inversion of the data input state, and the output of the second series arrangement provides the second node state.

2. The circuit of claim 1, wherein
the latch includes cross-coupled inverters.

3. The circuit of claim 2, wherein
the pulse generator includes a delay element that provides a delayed clock signal corresponding to the clock signal and shifted in time, and the first network configuration and the second network configuration are configured to provide the first node state and the second node state in dependence upon a combination of the clock signal and the delayed clock signal.

4. The circuit of claim 1, wherein
the pulse generator includes a delay element that provides a delayed clock signal corresponding to the clock signal and shifted in time, and the first network configuration and the second network configuration are configured to provide the first node state and the second node state in dependence upon a combination of the clock signal and the delayed clock signal.

5. The circuit of claim 4, wherein
the first series arrangement of switches is configured to be dependent upon the clock signal and the shifted clock signal, and the second series arrangement of switches is configured to be dependent upon the clock signal and the shifted clock signal.

6. The circuit of claim 1, further including:

a third network configuration that is configured to provide an input to a first terminal node where the first node state is generated, a fourth network configuration that is configured to provide an input to a second terminal node where the second node state is generated, and a second pulse generator that is configured to enable a propagation of test data to at least one of the first and second nodes, via at least one of the third and fourth network configurations.

7. A flip-flop comprising:

a first series of switches connected between a data input and a first node, a second series of switches connected between an inversion of the data input and a second node, and cross-coupled inverters connected between the first node and the second node, wherein the first series and second series of switches each include a clock-switch that is controlled by a clock signal, a clock-not-switch that is controlled by an inversion of the clock signal that is offset in time from the clock signal.

8. The flip-flop of claim 7, wherein
each of the first series and second series of switches comprises n-channel transistors.

9. The flip-flop of claim 7, wherein
the clock-switch of each of the first series and second series of switches is connected to the first node and second node, respectively, the clock-not-switch of the first series of switches is connected between the data input and the clock-switch of the first series of switches, and the clock-not-switch of the second series of switches is connected between the inversion of the data input and the clock-switch of the second series of switches.

* * * * *